United States Patent
Roth

(10) Patent No.: US 11,155,739 B2
(45) Date of Patent: Oct. 26, 2021

(54) RESIN-IMPREGNATED BORON NITRIDE BODY AND A METHOD FOR PRODUCING A RESIN-IMPREGNATED BORON NITRIDE BODY

(71) Applicant: Infineon Technologies AG, Neubiberg (DE)

(72) Inventor: Alexander Roth, Zeitlarn (DE)

(73) Assignee: Infineon Technologies AG, Neubiberg (DE)

(\*) Notice: Subject to any disclaimer, the term of this patent is extended or adjusted under 35 U.S.C. 154(b) by 441 days.

(21) Appl. No.: 15/824,158

(22) Filed: Nov. 28, 2017

(65) Prior Publication Data
US 2018/0148623 A1  May 31, 2018

(30) Foreign Application Priority Data

Nov. 28, 2016 (EP) ..................... 16200875
Nov. 7, 2017 (EP) ..................... 17200378

(51) Int. Cl.
| | | |
|---|---|---|
| *C09K 5/14* | (2006.01) |
| *C04B 41/48* | (2006.01) |
| *C04B 41/00* | (2006.01) |
| *C04B 41/49* | (2006.01) |
| *H01L 23/373* | (2006.01) |
| *C04B 41/83* | (2006.01) |
| *C04B 41/84* | (2006.01) |
| *C08J 5/24* | (2006.01) |
| *B29C 71/02* | (2006.01) |
| *C08K 3/38* | (2006.01) |
| *C04B 111/00* | (2006.01) |

(52) U.S. Cl.
CPC .............. *C09K 5/14* (2013.01); *C04B 41/009* (2013.01); *C04B 41/4853* (2013.01); *C04B 41/4961* (2013.01); *C04B 41/83* (2013.01); *C04B 41/84* (2013.01); *C08J 5/24* (2013.01); *C08J 7/08* (2013.01); *C08K 3/38* (2013.01); *H01L 23/373* (2013.01); *C04B 2111/00844* (2013.01); *C08J 2363/00* (2013.01); *C08J 2383/04* (2013.01); *C08K 2003/385* (2013.01); *C08K 2201/001* (2013.01)

(58) Field of Classification Search
None
See application file for complete search history.

(56) References Cited

U.S. PATENT DOCUMENTS

| | | | |
|---|---|---|---|
| 6,277,348 B1 | 8/2001 | Pujol et al. | |
| 2016/0130187 A1* | 5/2016 | Ikarashi | C04B 41/009 524/404 |
| 2016/0263791 A1* | 9/2016 | Uibel | B29C 45/77 |

FOREIGN PATENT DOCUMENTS

| | | |
|---|---|---|
| CN | 105263886 A | 1/2016 |
| EP | 0278734 A2 | 8/1988 |
| EP | 3006419 A1 | 4/2016 |

OTHER PUBLICATIONS

Journal of Materials Science 26 (1991) 196-202 (Year: 1991).*

\* cited by examiner

*Primary Examiner* — Robert T Butcher
(74) *Attorney, Agent, or Firm* — Murphy, Bilak & Homiller, PLLC

(57) ABSTRACT

A resin-impregnated boron nitride body includes a polymer-derived boron nitride and a resin. A process for manufacturing such a resin-impregnated boron nitride body includes: polymerizing a boron nitride molecular precursor into a preceramic polymer shaping the preceramic polymer to form an infusible polymer body; submitting the polymer body to a thermal treatment to obtain a boron nitride body; impregnating the boron nitride body with a resin; and curing the resin.

20 Claims, No Drawings

RESIN-IMPREGNATED BORON NITRIDE BODY AND A METHOD FOR PRODUCING A RESIN-IMPREGNATED BORON NITRIDE BODY

BACKGROUND

Regarding exothermic electronic parts such as power devices, double-side heat dissipation transistors, thyristors, CPU and the like, efficient heat dissipation during their use is important.

In recent years, higher speed and higher integration of the circuit in the exothermic electronic parts and higher density of the exothermic electronic parts being mounted onto the printed-wiring board have led to higher heat generation density and more precise structure in the electronic devices. Accordingly, heat-dissipating members having high thermal conductivity are required.

Boron nitride (NB) is a III-V compound and isoelectronic to carbon. Like carbon, it exists in various crystalline forms. The most stable crystalline form is the hexagonal one, also called h-BN, $\alpha$-BN, g-BN, and graphitic boron nitride. The cubic variety analogous to diamond is called c-BN. In addition, there exists a rare wurtzite boron nitride modification.

Because of excellent thermal and chemical stability, boron nitride ceramics are traditionally used as parts of high-temperature equipment.

Boron nitride is produced synthetically. Hexagonal boron nitride is obtained by reacting boron trioxide and/or boric acid with ammonia, melamine or urea in a nitrogen atmosphere.

Parts from hexagonal boron nitride can be fabricated inexpensively by hot-pressing (sintering) with subsequent machining. The parts are made from boron nitride powders adding sintering aids for better compressibility.

From EP 3006419 A1 a resin-impregnated boron nitride sintered body having superior thermal conductivity and superior strength is known. The resin-impregnated boron nitride sintered body is produced by impregnating a resin such as an epoxy resin into a boron nitride sintered body under vacuum and subsequent curing.

But there is still a need for resin-impregnated boron nitride bodies having improved and/or adjustable properties. For example, the fabrication of boron nitride parts with complex shapes is difficult to achieve using conventional powder routes.

SUMMARY

Accordingly, it is an object of the present invention to provide resin-impregnated boron nitride bodies with high thermal conductivity that, in addition, have improved and/or adjustable properties. It is also an object of the present invention to provide resin-impregnated boron nitride bodies that may have any shape, such as complex, non-rectangular shapes.

In accordance with the invention, the object is achieved by a resin-impregnated boron nitride body, comprising: 30 to 90 volume % of a boron nitride body wherein the boron nitride is polymer-derived boron nitride; and 10 to 70 volume % of a resin.

Those skilled in the art will recognize additional features and advantages upon reading the following detailed description, and upon viewing the accompanying drawings.

DETAILED DESCRIPTION

It has surprisingly been found that with the help of boron nitride bodies that have been produced from polymers many unconventional two-dimensional and three-dimensional structures, such as non-rectangular shapes, fibers, coatings, ceramic matrix composites and microelectromechanical systems (MEMS) can be easily fabricated without being detrimental to the thermal conductivity of the resin-impregnated boron nitride body.

Especially, resin-impregnated boron nitride bodies with non-rectangular shape allow for best fit into available areas.

Polymer-derived boron nitride has further advantages over conventionally produced boron nitride, including fabrication at lower temperature, lower production costs, lower impurity level, and homogeneous distribution of elements. A further advantage of polymer-derived boron nitride is that the manufacturing process requires no separation step or application of high pressures. Since the fabrication of polymer-derived boron nitride bodies occurs at lower temperatures the probability of tension occurring in the body during cooling is reduced.

In addition, the surface-to-volume ratio of polymer-derived boron nitride bodies is higher than in conventionally sintered boron nitride bodies. It has surprisingly been found that this leads to higher adhesion forces between the boron nitride body and the resin and, thus, to higher adhesion forces of metallizations present on the resin-impregnated boron nitride body.

Furthermore, in contrast to conventionally manufactured, i.e. sintered, boron nitride bodies a polymer-derived boron nitride body comprises large contiguous boron nitride structures that even lead to a higher thermal conductivity.

Depending on the application area, properties such as thermal conductivity, mechanical strength and/or expansion coefficient of a polymer-derived boron nitride body and, consequently, of a resin impregnated polymer-derived boron nitride body can be adjusted. It is even possible to set a preferred direction of the properties during manufacture.

Polymer-derived boron nitride is produced by pyrolysis of suitable molecular and polymeric precursors. This technique is usually referred to the polymer-derived ceramics (PDCs) technique. With the help of the PDC technique, boron nitride bodies having morphologies (dense or porous) that are difficult or even impossible to obtain by conventional routes can be manufactured.

The formation of polymer-derived boron nitride is composed of several sequences summarized as follows: (1) design and synthesis of a molecular precursor, (2) its polymerization into a preceramic polymer, (3) shape to form infusible polymer components, and (4) conversion into ultimate boron nitride ceramics by a high-temperature thermal treatment.

Ammonia-borane (AB) and borazine (BZ) can be used as single-source molecular precursors for the formation of boron nitride. The complete dehydrogenation of ammonia-borane leads to boron nitride through three steps forming liquid (borazine) and solid (polyamino-/iminoboranes and polyborazylene) intermediates.

It is preferred to use borazine as molecular precursor. Self-condensation of borazine at a temperature of 60° C. or greater leads to formation of solid polyborazylene as preceramic polymer. A thermolysis at 45-50° C. of borazine allows generation of a liquid polyborazylene.

Depending on the physical state of polyborazylene, different shaping processes can be used. Dilute solutions of polyborazylene in THF or glyme or the pure liquid polymer allow for solution-based shaping processes such as dip-coating of substrates or fibers and (nano)casting (infiltrating a polyborazylene solution or melt into a template mold).

Solid polyborazylene is preferred for plastic-forming techniques to prepare monolithic pieces. For example, polyborazylene synthesized at 60° C. exhibits adjusted properties and sufficient plasticity to be warm-pressed into shaped bodies.

Polyborazylene delivers boron nitride by pyrolysis under argon or ammonia in the temperature range of 900 to 1450° C. in excellent chemical and ceramic yield.

The use of dialkylamine-modified polyborazylenes, in particular dipentylamine-modified polyborazylene, as preceramic polymer allows melt-spinning to create fibers. Melt-spinning is not possible with unmodified polyborazylene. In order to obtain dialkylamine-modified polyborazylenes polyborazylene and dialkylamine are dissolved in glyme and heated at 75° C. under vacuum.

Introduction of alkylation groups in the molecular boron nitride precursors is more preferred. Such precursors are called B-(alkylamino)borazines. The corresponding preceramic polymers are poly[B-(alkylamino)borazines]. A preferred B-(alkylamino)borazine is B-tri(methylamino)borazine. By thermolysis of B-tri(methylamino)borazine in the temperature range of 160 to 185° C. poly[B-tri(methylamino)borazine] is obtained. Poly[B-tri(methylamino)borazine] can be melt-spun to create boron nitride fibers after subsequent curing and pyrolysis.

The resin-impregnated boron nitride body of the present invention is obtained by impregnating a resin into the boron nitride body, followed by curing.

The resin can be impregnated by vacuum impregnating, pressurized impregnating at 1 to 300 MPa (preferably 3 to 300 MPa), heated impregnating at room temperature to 150° C., or combination thereof. The pressure during the vacuum impregnating is preferably 1,000 Pa or lower, and more preferably 50 Pa or lower. By decreasing the viscosity of the resin, the resin can be impregnated homogeneously into the boron nitride body. Therefore, it is further preferable to increase the temperature to a temperature range of 30 to 300° C. and to decrease the viscosity of the resin, in particular when pressure is applied.

As the resin, epoxy resins, silicone resins, silicone rubbers, acrylic resins, phenol resins, melamine resins, urea resins, unsaturated polyesters, fluorine resins, polyamides such as polyimide, polyamide imide, polyether imide and the like, polyesters such as polybutylene terephthalate, polyethylene terephthalate and the like, polyphenylene ethers, polyphenylene sulfides, fully aromatic polyesters, polysulfones, liquid crystal polymers, polyether sulfones, polycarbonates, modified maleimide resins, ABS resins, AAS (acrylonitrile-acryl rubber-styrene) resins, AES (acrylonitrile·ethylene·propylene·diene rubber-styrene) resins, polyglycolic acid resins, polyacetals and the like can be used for example. It is preferred that the resin is a thermosetting resin. In particular, epoxy resins and silicone resins are most suitable. Accordingly, it is preferred that the resin comprises an epoxy resin and/or a silicone resin.

The resins, especially thermosetting resins, can contain further additives such as curing agents, inorganic fillers, silane coupling agents, antifoaming agents, surface conditioners, wetting agents, dispersing agents and the like.

In addition, it may be preferable that the resin contains one or more types of a ceramics powder selected from the group consisting of aluminum oxide, silicon oxide, zinc oxide, silicon nitride, aluminum nitride, and aluminum hydroxide.

The resin and the ceramics powder containing resin can be diluted with a solvent as necessary. As the solvent, alcohols such as ethanol, isopropanol and the like, ether alcohols such as 2-methoxyethanol, 1-methoxyethanol, 2-ethoxyethanol, 1-ethoxy-2-propanol, 2-butoxyethanol, 2-(2-methoxyethoxy)ethanol, 2-(2-ethoxyethoxy)ethanol, 2-(2-butoxyethoxy)ethanol and the like, glycol ethers such as ethylene glycol monomethyl ether, ethylene glycol monobutyl ether and the like, ketones such as acetone, methyl ethyl ketone, methyl isobutyl ketone and di-isobutyl ketone, hydrocarbons such as toluene and xylene can be mentioned for example. Here, these diluents can be used alone or two or more types can be used in combination.

The curing of the resin can be done by a thermal treatment or by a combination of elevated temperature and elevated pressure. The exact curing conditions depend on the nature of the resin. Thermal curing of silicone resins and/or epoxy resins may comprise heating of the resin-impregnated boron nitride body at a temperature between 120 and 180° C. for 30 to 120 minutes.

The porosity of the polymer derived boron nitride bodies can be tightly controlled by mixing the molecular precursor and/or the preceramic polymer with a template (e.g. carbon powder) and removal of the template by a second thermal treatment at higher temperatures as in boron nitride formation step (4). By using cylindrically shaped carbonaceous foams as templates in shaping step (3), it is possible to provide holes for vias in the boron nitride bodies.

A resin-impregnated boron nitride body according to the present invention can be used in power electronics and power modules. For example, the resin-impregnated boron nitride body according to the present invention can be used in a heat-dissipating member. The heat-dissipating member using the resin-impregnated boron nitride body of the present invention can be used as a substrate for power devices or power modules. In particular, the heat-dissipating member using the resin-impregnated boron nitride body according to the present invention can be used in a double-side heat dissipating power module for automobiles.

A resin-impregnated boron nitride body according to the present invention can also be a part of a multiple layer power substrate. In this embodiment, holes for vias may be present in the upper body.

In another embodiment, the resin-impregnated boron nitride body according to the present invention is a fiber prepreg that can be used for chip-embedding in multilayer printed circuit boards.

A further object of the invention is a process for manufacturing a resin-impregnated boron nitride body comprising the steps: polymerizing a boron nitride molecular precursor into a preceramic polymer, shaping the preceramic polymer to form an infusible polymer body, submitting the polymer body to a thermal treatment, impregnating the obtained boron nitride body with a resin, and curing of the resin.

The claimed process yields the resin-impregnated boron nitride body in a cost-efficient and tailor-made manner.

It is preferred that the preceramic polymer is selected from group consisting of liquid polyborazylene, solid polyborazylene, dipentyl-modified polyborazylene, poly[B-tri(methylamino)borazine] and mixtures thereof. These preceramic polymers allow manufacture of a boron nitride body with tailor-made properties und design.

In a preferred embodiment of the invention the boron nitride body exhibits at least one of the following properties: a specific surface area (SSA) of between $1\times10^7$ and $2\times10^9$ $m^2/m^3$, more preferable of between $5\times10^7$ and $5\times10^8$ $m^2/m^3$, an adhesive strength at the boron nitride/resin interface of between 1 $N/mm^2$ and 15 $N/mm^2$, a thermal conductivity in a preferred direction, preferably in z-direction, of between 30 W/(m·K) and 400 W/(m·K), a thermal conductivity in z-direction that is by at least 5% higher than in the other directions, a tensile strength in z-direction that is by at least 5% higher than in the other directions, and a coefficient of thermal expansion (CTE) in z-direction that is by at least 5% higher than in the other directions.

The specific surface area (SSA) is measured by adsorption using the BET isotherm according to ASTM C1274-12.

The adhesive strength at the boron nitride/resin interface is determined as N/mm² "Standard Test Method for Peel or Stripping Strength of Adhesive Bonds" according to ASTM D903-98(2010).

The thermal conductivity is determined according to ASTM C1470-06(2013) and referenced instructions.

The tensile strength is determined according to ASTM C1273-15.

The coefficient of thermal expansion (CTE) is determined according to ASTM C1470-06(2013) and referenced instructions.

Accordingly, in a preferred embodiment shaping of the preceramic polymer comprises warm-pressing, melt-spinning, dipping or casting.

In another preferred embodiment does the process further comprise the step of mixing the molecular precursor and/or the preceramic polymer with a template. Preferably, the template is a carbon powder and/or a carbonaceous foam.

In yet another preferred embodiment the resin is a thermosetting resin, in particular an epoxy resin and/or a silicone resin.

In a preferred embodiment the thermal treatment of the polymer body is carried out at a temperature of between 1,000° C. and 1,400° C., preferably between 1150° C. and 1250° C.

It may be also preferred that the polymer-derived boron nitride body is post-processed at a temperature of between 1,750° C. and 2,200° C., more preferred at 1800° C., in order to obtain hexagonal boron nitride (h-BN). The post-processing is carried out before impregnating the polymer-derived boron nitride body with the resin.

With respect to further preferred embodiments of the process of the invention apply mutatis mutandis to the inventive resin-impregnated boron nitride body.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A resin-impregnated boron nitride body, comprising:
   30 to 90 volume % of a boron nitride body wherein the boron nitride is polymer-derived boron nitride; and
   10 to 70 volume % of a resin,
   wherein a tensile strength of the boron nitride body in a z-direction of the boron nitride body is at least 5% higher than in other directions of the boron nitride body.

2. The resin-impregnated boron nitride body of claim 1, wherein the polymer-derived boron nitride is derived from a preceramic polymer selected from the group consisting of polyborazylene, dialkyl-modified polyborazylene, poly[B-(alkylamino)borazine] and mixtures thereof.

3. The resin-impregnated boron nitride body of claim 1, wherein the resin is a thermosetting resin.

4. The resin-impregnated boron nitride body of claim 1, wherein the boron nitride body has a thermal conductivity of between 30 W/(m·K) and 400 W/(m·K) in at least one direction.

5. The resin-impregnated boron nitride body of claim 1, wherein the boron nitride body has a thermal conductivity in a z-direction that is by at least 5% higher than in other directions.

6. The resin-impregnated boron nitride body of claim 1, wherein the coefficient of thermal expansion of the boron nitride body in the z-direction is at least 5% higher than in other directions.

7. A heat-dissipating member comprising the resin-impregnated boron nitride body of claim 1.

8. A substrate for power device or a power module comprising the heat-dissipating member of claim 7.

9. A method of manufacturing the resin-impregnated boron nitride body of claim 1, the method comprising:
   polymerizing a boron nitride molecular precursor into a preceramic polymer;
   shaping the preceramic polymer to form an infusible polymer body;
   submitting the polymer body to a thermal treatment to obtain a boron nitride body;
   impregnating the boron nitride body with a resin; and
   curing the resin.

10. The method of claim 9, wherein the preceramic polymer is selected from group consisting of liquid polyborazylene, solid polyborazylene, dipentylamine-modified polyborazylene, poly-[B-tri(methylamino)borazylene] and mixtures thereof.

11. The method of claim 9, further comprising:
    mixing the molecular precursor and/or the preceramic polymer with a template.

12. The method of claim 11, wherein the template is selected from the group consisting of carbon powders, carbonaceous foams and mixtures thereof.

13. The method of claim 9, wherein the shaping of the preceramic polymer comprises warm-pressing, melt-spinning, dipping or casting.

14. The method of claim 9, wherein the resin is a thermosetting resin.

15. The method of claim 14, wherein the thermosetting resin is an epoxy resin and/or a silicone resin.

16. The method of claim 9, wherein the thermal treatment of the polymer body is carried out at temperature of between 1,000° C. and 1,400° C.

17. The method of claim 9, further comprising:
    post-processing the boron nitride body at a temperature of between 1,750° C. and 2,200° C.

18. A resin-impregnated boron nitride body, comprising:
    30 to 90 volume % of a boron nitride body wherein the boron nitride is polymer-derived boron nitride; and
    10 to 70 volume % of a resin,
    wherein the boron nitride body has a specific surface area (SSA) of between $1 \times 10^7$ and $2 \times 10^9$ m²/m³.

19. A resin-impregnated boron nitride body, comprising:
    30 to 90 volume % of a boron nitride body wherein the boron nitride is polymer-derived boron nitride; and
    10 to 70 volume % of a resin,
    wherein the boron nitride body has an adhesive strength at an interface between boron nitride and resin that is between 1 N/mm² and 15 N/mm².

20. A resin-impregnated boron nitride body, comprising:
    30 to 90 volume % of a boron nitride body wherein the boron nitride is polymer-derived boron nitride; and
    10 to 70 volume % of a resin,
    wherein a coefficient of thermal expansion of the boron nitride body in the z-direction is at least 5% higher than in other directions of the boron nitride body.

* * * * *

UNITED STATES PATENT AND TRADEMARK OFFICE
CERTIFICATE OF CORRECTION

PATENT NO. : 11,155,739 B2
APPLICATION NO. : 15/824158
DATED : October 26, 2021
INVENTOR(S) : A. Roth Page 1 of 1

It is certified that error appears in the above-identified patent and that said Letters Patent is hereby corrected as shown below:

On the Title Page

Column 2, abstract (Line 5), please change "polymer shaping" to -- polymer; shaping --.

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*